(12) United States Patent
Hamilton et al.

(10) Patent No.: US 7,113,431 B1
(45) Date of Patent: Sep. 26, 2006

(54) QUAD BIT USING HOT-HOLE ERASE FOR CBD CONTROL

(75) Inventors: Darlene Hamilton, San Jose, CA (US);
Alykhan Madhani, Santa Clara, CA (US); Fatima Bathul, Cupertino, CA (US); Satoshi Torii, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 15 days.

(21) Appl. No.: 11/091,982

(22) Filed: Mar. 29, 2005

(51) Int. Cl.
*G11C 16/14* (2006.01)

(52) U.S. Cl. .......................... 365/185.29; 365/185.03; 365/185.02

(58) Field of Classification Search ............... None
See application file for complete search history.

(56) References Cited

U.S. PATENT DOCUMENTS

| 6,317,364 | B1 * | 11/2001 | Guterman et al. ...... 365/185.28 |
| 6,331,951 | B1 * | 12/2001 | Bautista et al. ........ 365/185.22 |
| 6,396,741 | B1 * | 5/2002 | Bloom et al. .......... 365/185.22 |
| 6,744,675 | B1 * | 6/2004 | Zheng et al. .......... 365/185.28 |

OTHER PUBLICATIONS

"An Embedded 90mm SONOS Flash EEPROM Utilizing Hot Electron Injection Programming and 2-Sided Hot Hole Injection Erase", E.J. Prinz, G.L. Chindalore, K. Harber, C.M. Hong, C.B. Li and C.T. Swift, reprinted from the Internet at: http://64.233.161.104/search?q=cache:dnXcWWMDMAQJ:www.freescale.com/files/technology_manufacturing/doc/NVM_WORKSHOP_2003_SONOS1.pdf+Motorola+An+Embedded+90nm+SONOS+Flash+EEPROM&hl=en, 2 pgs.

* cited by examiner

*Primary Examiner*—Tan T. Nguyen
(74) *Attorney, Agent, or Firm*—Eschweiler & Associates, LLC

(57) ABSTRACT

The present invention pertains to a technique for erasing bits in a dual bit memory in a manner that maintains complementary bit disturb control of bit-pairs of memory cells wherein each bit of the dual bit memory cell can be programmed to multiple levels. One exemplary method comprises providing a word of memory cells after an initial erasure and programming of the bits of the word to one or more of the higher program levels. A disturb level is determined for each of the bit-pairs of the word. A combined disturb level is then computed that is representative of the individual disturb levels. A pattern of drain voltages is then applied to the word for a number of program passes until a target pattern is stored in the word of memory cells based on the combined disturb level and the unprogrammed bit of the bit-pairs is erased to a single program level. In this manner the present invention compensates for the disturbance level that exists between the complementary bit-pairs of the word, improves the Vt distribution at the program level of the erased state and thereby improves the accuracy of subsequent higher level programming operations and mitigates false or erroneous reads of the states of such program levels.

21 Claims, 11 Drawing Sheets

No fix =       00
A fix  =       10
B fix  =       01
A&B (SB) fix = 11

QUAD BIT USING HOT-HOLE ERASE FOR CBD CONTROL

FIELD OF INVENTION

The present invention relates generally to memory devices for computer systems and the like, and in particular to a technique of programming single and multilevel Flash memory devices to high levels while maintaining CBD control at low levels.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling, however other mechanisms of programming and/or erasing can be employed.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The memory cell generally has a source, a drain, and a channel formed there between, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash memory cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by a suitable mechanism, such as hot electron injection. Programming with hot-hole injection involves applying a relatively high voltage to the control gate and connecting the source to ground and the drain to a predetermined potential above the source. When a resulting electric field is high enough, electrons collect enough energy to be injected from the source onto the control gate. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. A source read voltage is applied at the source and a drain read voltage is applied at the drain. The drain read voltage is greater than the source read voltage. A read gate voltage is then applied to the gate (e.g., the wordline) of the memory cell transistor that is greater than the drain read voltage in order to cause a current to flow from the drain to source. The read operation gate voltage is typically applied at a level between a programmed threshold voltage (Vt) and an unprogrammed threshold voltage. The resulting current is measured, by which a determination is made as to the data value stored in the cell.

Another type of flash memory is dual bit memory, which allows multiple bits to be stored in a single cell. In this technology, a memory cell is essentially split into two identical (mirrored) or complementary parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer (or die).

One technique to pack more memory cells/transistors into a smaller area is to form their structures and component elements closer together. Forming bitlines closer together, for example, shortens the length of a channel defined therebetween and allows more devices to be formed in the same area. This can, however, cause certain undesirable phenomena to become more prevalent. For example, isolating two bits or charges stored within a charge trapping layer becomes increasingly difficult as the channel length is decreased and the bits are brought closer together. In this manner, the charge on the bits can contaminate or disturb one another, causing operations performed on the bits to be more challenging and introducing a greater opportunity for error. This interdependency or the affect that bits can have on one another is sometimes referred to as complementary bit disturb or CBD. Accordingly, it would be desirable to be able to operate on, and in particular, to program and erase complementary bits of data to and from a memory cell in a manner that mitigates the affects that the bits have on one another while improving the Vt distribution of the erased and programmed bit states.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to a technique for erasing to a low level (L1), the unprogrammed bits of adjacent bit-pairs of multi-level dual bit memory cells, which tend to have an interdependent effect on one another. Multi-level dual bit (MLDB) memory cells comprise two (complementary) bits in a single physical memory cell, wherein each bit can be programmed to multiple levels. In accordance with the present invention, one exemplary implementation of an MLDB memory cell comprises two complementary bits in a single physical cell, wherein each bit utilizes four program levels (e.g., L1, L2, L3, and L4), the cell called a "quad-bit cell" (QBC). As discussed in connection with the complementary bit disturb, however, such complementary bit-pairs existing within close confines may have an affect on one another that tends to alter the effective Vt of the bits within the MLDB cells.

In particular, the method of the present invention is suitable for application subsequent to programming words, cells, or other bit groupings of the array to one of the multiple higher levels for improved CBD control of QBC and other such MLDB memory cells including any multi-level and multi-bit memory cells. According to one aspect of the present invention, after the bits are programmed to the higher levels, any unprogrammed bits of each bit-pair are then erased to a final level, for example, an L1 erased state using hot-hole injection.

It is a goal of the present invention to achieve improved CBD control of MLDB cells in order to improve the Vt distribution of the cells at all programmed levels, and in particular, at the level of the erased state. According to one or more other aspects of the present invention, by erasing the unprogrammed bits of the MLDB memory cells to a single level such as the erased state, the Vt distribution of the bits at the erased state may be improved. As a result, upon subsequent programming of those erased bits to various higher levels, the Vt distribution at the higher levels may be improved as well.

In another aspect of the invention, the erase operation may be custom tailored to compensate a combined disturb level representative of all the individual disturb levels of the complimentary bit-pairs of a word of selected memory cells to provide an improved Vt distribution of the bits of the memory cells. In accordance with another aspect of the present invention the combined disturb level may be computed as an average, a mean, a sum, a sigma, or any other such function representative of all the individual disturb levels of the complimentary bit-pairs.

In yet another aspect of the invention, this compensation may be accomplished by adjusting or selecting an appropriate pattern of drain voltages that is applied to the memory cells during a subsequent erase of the unprogrammed bits of the selected memory cells, based on a target pattern to be stored in the cells of the array and by multiple passes of the pattern thru the selected memory cells of the memory array.

In accordance with still another aspect of the present invention, the pattern of drain voltages used to compensate the CBD, comprises a float condition, a predetermined level of drain voltage, and a predetermined level of inhibit voltage that is applied to the group of memory cells in a predetermined series or pattern that stores a target pattern in the group of selected memory cells and erases the unprogrammed bits. The particular pattern and sequence of these float, drain, and inhibit voltages provide a way to erase select bits of cells and inhibit others from being erased. Thus, a pattern or sequence of patterns may be conceived and utilized to store any desired target pattern in the group of memory cells.

As the pattern is applied to the selected group of memory cells, the pattern is progressively shifted and reapplied to the memory cells in two or more (e.g., 2 or 3) passes until a target pattern has been stored in the cells, and thereby erasing the unprogrammed bits in the process. This process is similar to that of testing a memory with a checkerboard test pattern, wherein a predetermined test pattern is applied to a memory, then shifted or offset and reapplied to the memory any number of times. In the case of the present invention, the pattern, or another such offset derivative of the pattern is applied to the group of memory cells until the target pattern has been stored in the cells.

In another aspect of the present invention, after the combined disturb level has been determined, a particular drain and inhibit voltage level may be selected or otherwise adjusted, for example, to create a stronger field in the hot hole erase for erasing groups of bits experiencing higher CBD levels. For example, a higher drain voltage may be applied to a pattern when the complementary bit-pairs are more divergent (e.g., 1-4, or 1-3) bit-pair combinations, while a lower drain voltage may be more suitable for less divergent (e.g., 1-1, or 1-2) bit-pair combinations. Herein, the level and corresponding state of each bit in a bit-pair of a MLDB memory cell (e.g., a "quad-bit cell) is indicated by two numbers separated by a dash. For example, "3-2" identifies a cell having two physical bits, wherein the first bit is programmed to the third Vt level or logical state, and the second bit of the pair is programmed to the second Vt level or logical state.

According to one or more aspects of the present invention, the selected group of memory cells may be selected from a single word line.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
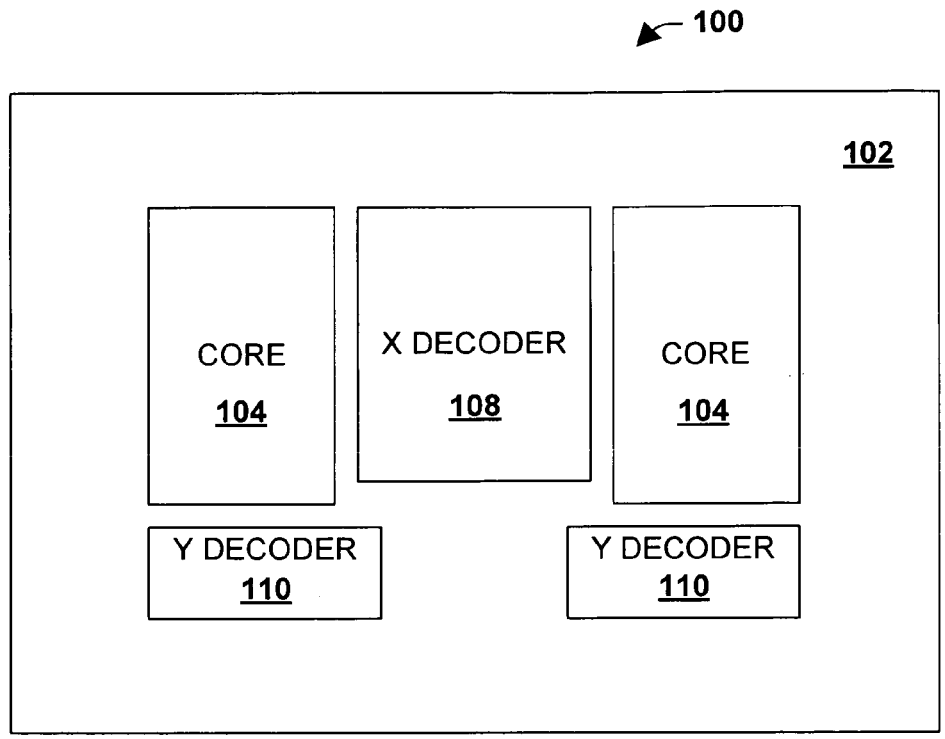
FIG. 1 is a top view of a dual bit flash memory device.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form in order to facilitate describing one or more aspects of the present invention.

The present invention pertains to a method of erasing to maintain complimentary bit disturb control of a word or group of complimentary bit-pairs of memory cells where each bit of the dual bit memory cell can be programmed to multiple levels. One or more aspects of the present invention consider the affect that the level of charge on one bit can have on the other bit, otherwise known as complimentary bit disturb. A predetermined checkerboard pattern of drain voltage levels is applied to the word in several passes to store a target pattern in the word and erase the unprogrammed bits. By adjusting or selecting the level of the drain voltages applied to the memory cells, compensation is provided for the level of disturbance (CBD level) present in the group of cells. In this manner, erasing the bit or program level in accordance with one or more aspects of the present invention improves (e.g., decreases) the Vt distribution at the program level of the erased state and thereby improves the accuracy of subsequent higher level programming operations and mitigates false or erroneous reads of the states of such program levels.

Referring initially to FIG. 1, a top view of an exemplary dual bit flash EEPROM 100 is illustrated. The memory 100 generally includes a semiconductor substrate 102 in which one or more high-density core regions 104 and one or more lower-density peripheral portions are formed. The high-density core regions typically include one or more M by N arrays 104 of individually addressable, substantially identical dual bit flash memory cells. The lower-density peripheral portions on the other hand typically include programming circuitry for selectively addressing the individual memory cells. The programming circuitry is represented in part by and includes one or more x-decoders 108 and one or more y-decoders 110 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
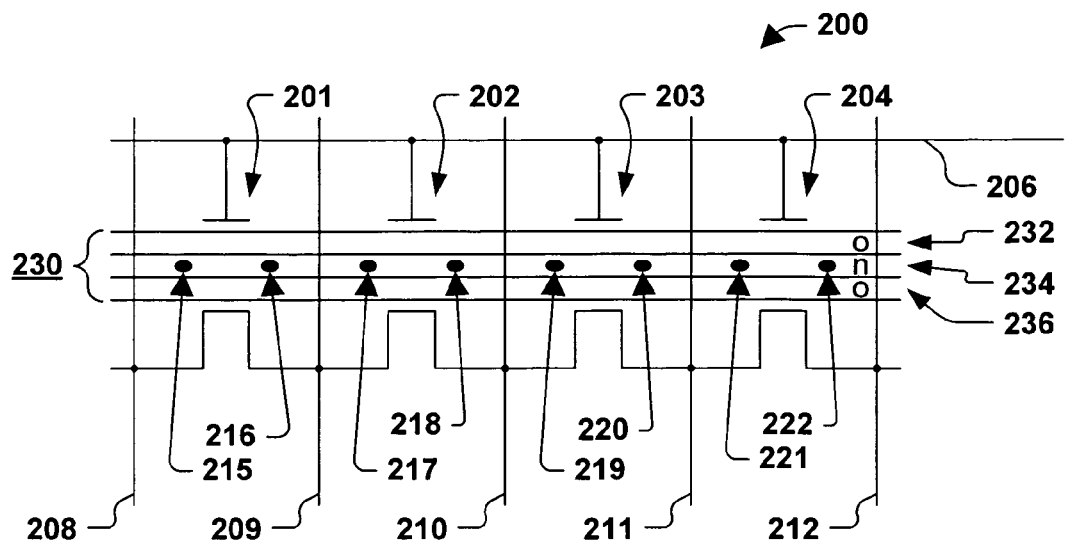
FIG. 2 is a schematic illustration of a portion of a memory core of dual-bit cells such as may include at least part of one of the cores depicted in FIG. 1 in a virtual ground type configuration.

Turning to FIG. 2, a schematic illustration is presented of a portion 200 of a memory core such as may include at least part of one of the M by N array cores 104 depicted in FIG. 1. The circuit schematic shows a group of memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon wordline voltages and bitline connections, the memory cells 201 through 204 are capable of writing, reading, and erasing bits at locations 215 through 222. In addition to voltages applied to the wordline 206, control of the bit at location 215, for example, is achieved through connection of the drain to the bitline 208 and the source to the bitline 209. Similarly, control of the bit at location 216 is achieved through connection of the drain to the bitline 209 and the source to the bitline 208. Storage of multiple bits is made possible, at least in part, by a charge trapping dielectric layer 230 interposed between the bitlines and the wordline. The charge trapping dielectric layer 230 includes multiple insulating layers 232, 236 (e.g., of oxide based material) that sandwich a charge trapping layer 234 (e.g., of nitride based material). Given its layer to layer composition, the charge trapping dielectric layer 230 is often referred to as an ONO layer.

The ONO layer 230 allows the different bits to be stored at multiple states or levels as well. For example, depending upon the voltage applied to the memory cells 201 through 204 by the control gate or wordline 206 during programming, varying amounts of charge can be stored at locations 215 through 222. The different amounts of charge may correspond to different bit states or levels, for example. If four different charge levels (e.g., 1, 2, 3 and 4) can be stored at each of the bit locations 215 through 222, for example, then each two-bit cell 201 through 204 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4).

Figure 3:
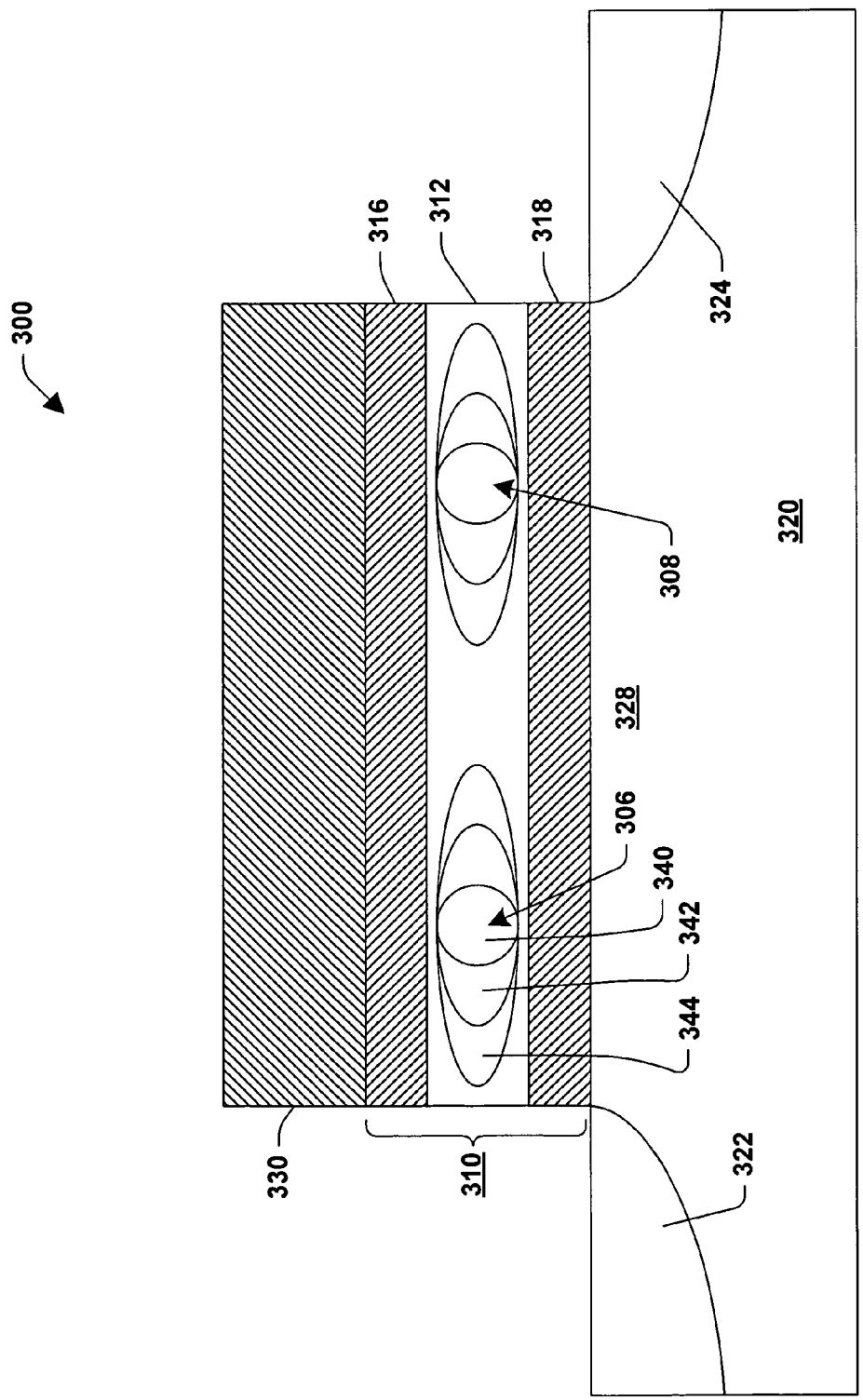
FIG. 3 is a cross-sectional view of a dual bit memory cell wherein each of the bits can be stored at multiple levels.

FIG. 3 is a cross sectional view of a dual bit memory cell 300 illustrating the capability of the cell to store varying degrees of charge at dual bit locations 306, 308. It will be appreciated that the memory cell 300 may, for example, correspond to the memory cells 201 through 204 depicted in FIG. 2. The cell 300 includes a charge trapping dielectric layer 310 that comprises a charge trapping layer 312 sandwiched between two dielectric layers 316, 318. The charge trapping layer 312 is formed from one or more substantially non-conductive substances, such as nitride based materials. The dielectric layers 316, 318 are similarly formed from one or more electrically insulating substances, such as oxide based materials. The layer to layer arrangement, for example, oxide, nitride, oxide layer of the charge trapping dielectric layer 310 often leads it to be referred to as an ONO layer.

The charge trapping layer 310 is formed over a substrate 320 that may be formed from silicon or some other semiconductor material, for example. The substrate 320 may be selectively doped with a p-type dopant, such as boron, for example, to alter its electrical properties. In the example illustrated, the substrate 320 has buried bitlines or bitline diffusions including a first bitline diffusion 322 and a second bitline diffusion 324. The bitline diffusions 322 and 324 may, for example, be formed by an implanted n-type dopant, and may correspond to bitlines 208 through 212 in FIG. 2. A channel 328 is defined within the substrate between the first 322 and second 324 bitline diffusions (e.g., S/D extensions, deep S/D regions).

Overlying the upper dielectric layer 316 of the charge trapping dielectric layer 310 is a gate 330. This gate 330 may be formed from a polysilicon material, for example, and may be doped with an n-type impurity (e.g., phosphorus) to alter its electrical behavior. The gate may, for example, correspond to the wordlines 206 in FIG. 2. The gate 330 enables a voltage to be applied to the cell 330 such that respective charges can, among other things, be stored within the cell at locations 306, 308, depending upon the electrical connections of the bitline diffusions 322, 324.

The dual bit memory cell 300 is generally symmetrical, thus the bitline diffusions 322 and 324 are interchangeable as acting source and drain. Thus, the first bitline diffusion 322 may serve as the source and the second bitline diffusion 324 as the drain with respect to right bit location 308. Likewise, the second bitline diffusion 324 may serve as the source and the first bitline diffusion 322 as the drain for the left bit location 306. The cell 300 can be programmed by applying a voltage across the gate 330 and an acting drain region, and connecting an acting source region to ground.

When programming the cell 300, the acting drain region is typically biased to a potential above the acting source. As a result of the gate bias, a high electric field is applied across the charge trapping layer 312. Due to a phenomenon known as "hot electron injection", electrons pass from the acting source region through the lower dielectric layer 318 and become trapped in the charge trapping layer 312 at locations 306 or 308. It will be appreciated that a second bit can be programmed to the alternate location 308 or 306 by reversing the acting source and drain and again applying a bias to the control gate 330.

By way of example, the left bit location 306 can be programmed by applying a program voltage to the gate 330 and a drain voltage to the second bitline 322, which is an acting drain for the left location 306. The first bitline 324, which is an acting source for programming the left bit location 306, can be connected to ground, left to float, or biased to a different voltage level. The applied voltages generate a vertical electric field through the dielectric layers 318 and 316 and also through the charge trapping layer 312, and generate a lateral electric field across a length of the channel 328 from the first bitline diffusion 322 to the second bitline diffusion 324. At a given voltage, the channel 328 inverts such that electrons are drawn off the acting source (the first bitline diffusion 324 in this example) and begin accelerating towards the acting drain (the second bitline diffusion 322 in this example).

As the electrons move along the length of the channel 328, the electrons gain energy and, upon attaining enough energy, the electrons jump over the potential barrier of the bottom dielectric layer 318 and into the charge trapping layer 312, where the electrons become trapped. The probability of electrons jumping the potential barrier in this arrangement is a maximum in the area of the left bit location 306, adjacent the first bitline diffusion 322, where the electrons have gained the most energy. These accelerated electrons are termed hot electrons and, once injected into the charge trapping layer 312, stay in about the general area indicated for the left bit. The trapped electrons tend to remain generally localized due to the low conductivity of the charge trapping layer 312 and the low lateral electric field therein. Programming the right bit location 308 is similar, but the first bitline 324 operates as an acting drain and the second 322 operates as an acting source.

For a read operation, a certain voltage bias is applied across an acting drain to an acting source of the cell 300. The acting drain of the cell is a bitline, which may be connected to the drains of other cells in a byte or word group. A voltage is then applied to the gate 330 (e.g., the wordline) of the memory cell 300 in order to cause a current to flow from the acting drain to the acting source. The resulting current is measured, by which a determination is made as to the value of the data stored in the cell. For example, if the current is above a certain threshold, the bit is deemed unprogrammed or a logical one, whereas if the current is below a certain threshold, the bit is deemed to be programmed or a logical zero. A second bit can be read by reversing operations of the first and second bitline diffusions 322 and 324 for the acting drain and the acting source.

It can be appreciated that if the voltages utilized to program the left 306 and right 308 bit locations of the cell 300 are increased or sustained for longer periods of time, the number of electrons or amount of charge stored at these locations can be increased or otherwise varied. This allows the cell 300 to be utilized for additional data storage. For example, different amounts of charge can correspond to different programmed states. In the example illustrated, for instance, both the left 306 and right 308 bit locations can be said to have four different states or levels, namely 1, 2, 3 and 4, where level 1 corresponds to a situation where the locations are blank or un-programmed, and levels 2, 3 and 4 correspond to increased amounts of stored charge, respectively. With regard to the left bit location 306, for example, a level 2 may correspond to a relatively small amount of stored charge 340, while levels 3 and 4 may correspond to increasingly larger amounts of stored charge 342 and 344, respectively. This technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional flash memory cells. Thus, in the example above, a single mirror-bit/dual-bit cell may store two physical bits of data at each of four Vt levels corresponding to four logical states.

Figure 4:
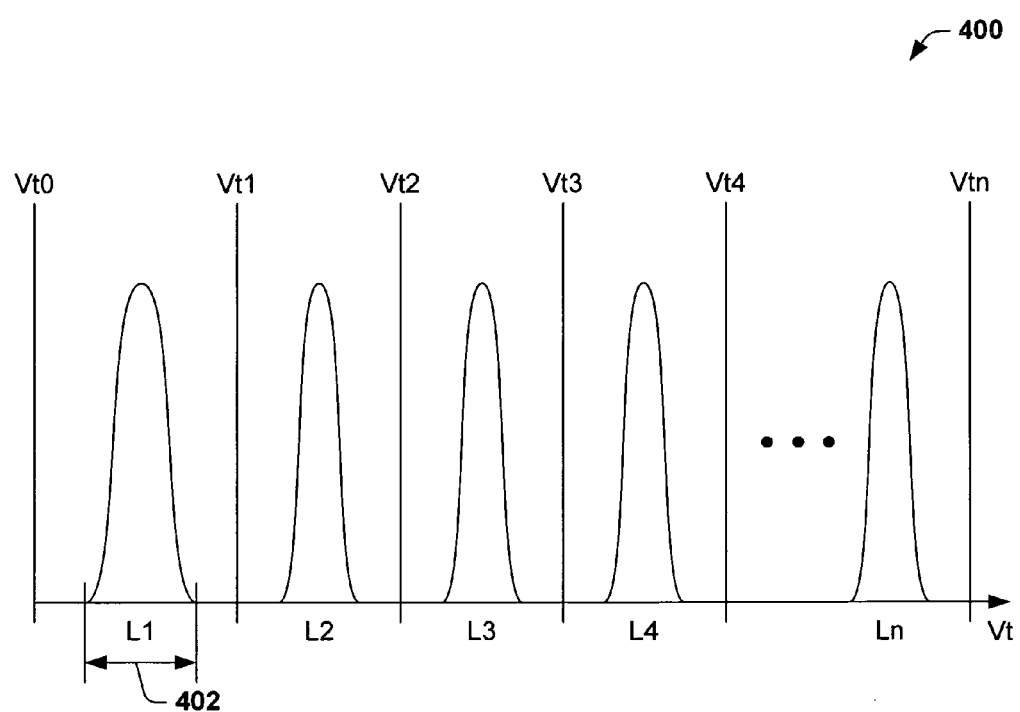
FIG. 4 is a Vt distribution of a four-level multi-level cell in accordance with an aspect of the present invention.

FIG. 4, for example, illustrates an unsigned Vt distribution 400 of a four level dual-bit cell (MLDB) in accordance with an aspect of the present invention. Vt distribution 400 represents a population of memory cell threshold voltages centered about four discrete target threshold voltages. Each target threshold voltage occupies a range of Vt values designated by levels L1, L2, L3, and L4, respectively.

Ideally, each level would be centered between upper and lower Vt limits, for example, Vt0, Vt1, Vt2, Vt3, and Vt4. The various levels may be arbitrarily assigned corresponding binary states (e.g., L1=11, L2=10, L3=01, and L4=00, or L1=00, L2=01, L3=10, and L4=11) as desired by the user. The four level dual-bit cell associated with the distribution 400 may comprise a single physical bit that can be programmed to four levels, or alternatively, may comprise a dual-bit or mirror-bit cell having two physically distinct bits that may each be programmed to multiple levels such as four, wherein 16 possible states are then available.

The method of the present invention is suitably implemented in MLDB memory devices having any combination of both positive and negative Vt distributions. In FIG. 4, for example, the method of the present invention is equally applicable whether Vt0, Vt4, or another such Vt level is used as a zero voltage potential or another reference potential of the memory cells. Considering the four level, dual-bit memory cell example of FIG. 4, the method of the present invention may be used, for example, to erase the unprogrammed bits of a word of memory cells to a threshold voltage value corresponding to the L1 data state after the higher levels (e.g., L2, L3, and L4 data states) have been programmed. Although the example would seem to imply that the L1 level corresponds to the erased condition, the L1, L4, or any other level may represent the erased state.

With reference back to FIG. 3, it can be appreciated that the quantity of charge stored in the respective locations 306 and 308 influences the amount of current that flows between the acting source 322, 324 and the acting drain 324, 322 during a read operation, as well as the threshold voltage (Vt) required to cause such current to flow. Thus, the level of stored bits can be determined by examining drain to source currents as well as corresponding applied threshold gate (wordline) voltages. In particular, low currents and high gate voltages may be indicative of higher and higher bit levels. Thus, measured currents and/or threshold voltages that fall within first, second, third or fourth ranges may, for example, be indicative of a level 1, level 2, level 3 or level 4, respectively for the stored bit.

It can be further appreciated, however, that even though the charge trapping layer 312 is substantially non-conductive and electrons trapped therein remain substantially localized within regions 306 or 308, the effects of complimentary bit disturb can manifest to a greater degree where dual bits can be programmed to different levels, such as 340, 342 and 344. For example, if left bit location 306 is un-programmed (level 1) or is only slightly programmed (level 2) and right bit location 308 is highly programmed (level 4), then some of the charge utilized to program the right bit may increase the charge on the left bit, causing the left bit to read a higher level than intended, or rather causing the threshold voltage necessary to read the left bit to be inflated such that this Vt is more indicative of a level 3 rather than the actual level 1 or level 2 of the left bit. Similarly, the charge on the left bit may cause the right bit to read a lower current than intended, or rather cause the threshold voltage necessary to read the right bit to be inflated such that this Vt is more indicative of a higher Vt level bit.

Figure 5:
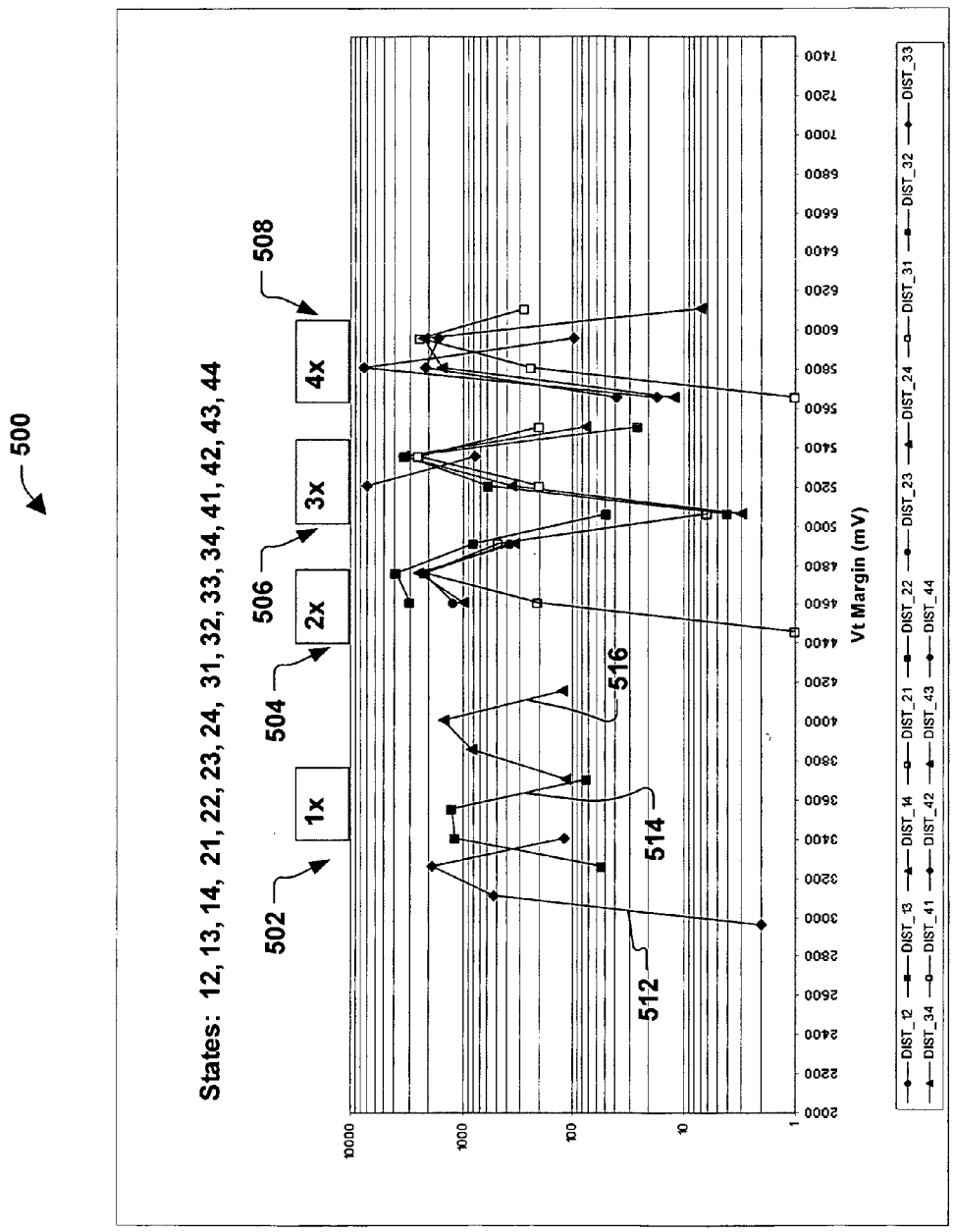
FIG. 5 is a graph illustrating threshold voltage distributions for an array of cells and the affect that dual bits can have on one another, particularly where the bits are stored at different levels, such as may include dual-bit four-level MLDB memory cells.

FIG. 5 is a graph 500 that illustrates such a situation where dual bits within a cell can be programmed to four different levels, and where the charges on the cells can affect one another, as described for the CBD. A threshold voltage (Vt) margin for a first or left bit as measured in milli-volts (mV) is plotted on the x-axis, while the distribution or number of occurrences for particular Vt's is plotted on the y-axis on a logarithmic scale. The graph 500 includes four different exemplary groupings of curves 502, 504, 506, 508 corresponding to the four different levels to which the first or left bit can be programmed. Each of the groupings contains a plurality of curves that reveal the shift in Vt for the left bit as the level of the right bit is altered (e.g., increased).

For example, grouping 502 includes three curves 512, 514, 516 that correspond to program states of 1-2, 1-3 and 1-4, respectively, which may correspond to the left bit being blank and the right bit being programmed to three different states, for example. It can be seen that as the right bit is programmed harder, a range of values of Vt for the left bit (which remains at a (blank) level 1 in all of the curves 512, 514, 516 in grouping 502) increases. In curve 512, for example, where the first or left bit is programmed to a level 1 and the second or right bit is programmed to a level 2 (e.g., 1-2), the value of Vt for the left bit falls within a range of between about 3000 to about 3500 milli-volts blank Vt (blank threshold Vt). In curve 516, however, where the right bit is programmed to level 4 (e.g., 1-4), the range of Vt values for the left bit is shifted upwards and is higher than the original blank Vt. This shift in Vt for the left bit is a function of the change in threshold Vt(delta Vt=program Vt for level 4−blank Vt) of the right bit (which is programmed to level 4), or is equal to Vt blank+a function of program deltaVt level of right bit (which is level 4).

It can be appreciated that, while not as dramatic, similar shifts occur where the left bit is programmed to levels 2, 3, and 4 and the right bit cycles through programmed levels 1, 2, 3, and 4. This can be seen in groupings 504, 506 and 508, respectively. More importantly, it can be seen that such shifts may cause some ranges to overlap. For example, there may appear to be some slight overlap (e.g., some 2×distributions (504) overlapping 3×distribution Vt region (506)) between grouping 504 where the left bit is programmed to a level 2 and grouping 506 where the left bit is programmed to a level 3. Thus, a Vt shift in this population of level 3 bits may cause the left bit to be (mis)interpreted as a level 2 when it should be a level 3 or vice versa (e.g., a 2-2 instead of a 3-2 or 3-3 or vice versa).

As such, cells having multiple levels and in particular dual-bit cell multi-level, present many new problems attempting to maintain well controlled or tight distributions of the Vt levels, particularly as larger data bit quantities are considered. As a result of these trends, accurate erasure, programming, and the determination of the levels of such multi-level cells becomes increasingly demanding, particularly as higher bit capacities are expected of a single cell. Accordingly, dual-bit multi-level memory cells need to be erased quickly and accurately to insure a well controlled narrow erase distribution (tight bit compacting) to insure subsequent program operations also will produce narrow program Vt distributions. Such device requirements and issues are likely to increase as device features continue to shrink and the density of memory cells increases.

Memory device manufactures often guarantee specific values of speed, endurance, reliability, and the power consumed during a variety of operating modes. These device specifications or operating parameters are beneficial to the user to insure a device performs as intended. Accordingly, it is a goal of the present invention to provide a method of erasing a word or group of suitable MLDB flash memory cells, which achieves the aforementioned requirements while also providing well controlled CBD levels and narrow erase distributions during the applicable operating modes.

The word erase algorithm of the present invention may be used to erase the unprogrammed bits of a specified word or group of cells of an array of multi-level flash memory cells to a single data state. The algorithm achieves well controlled CBD levels and compact Vt distributions compared to that of a conventional method. The method may be suitably implemented in a variety of flash memory architectures including dual-bit EEPROM and other such multi-bit memory architectures that may be electrically erased, and any such cell or variant is contemplated as falling within the scope of the present invention.

Figure 6:
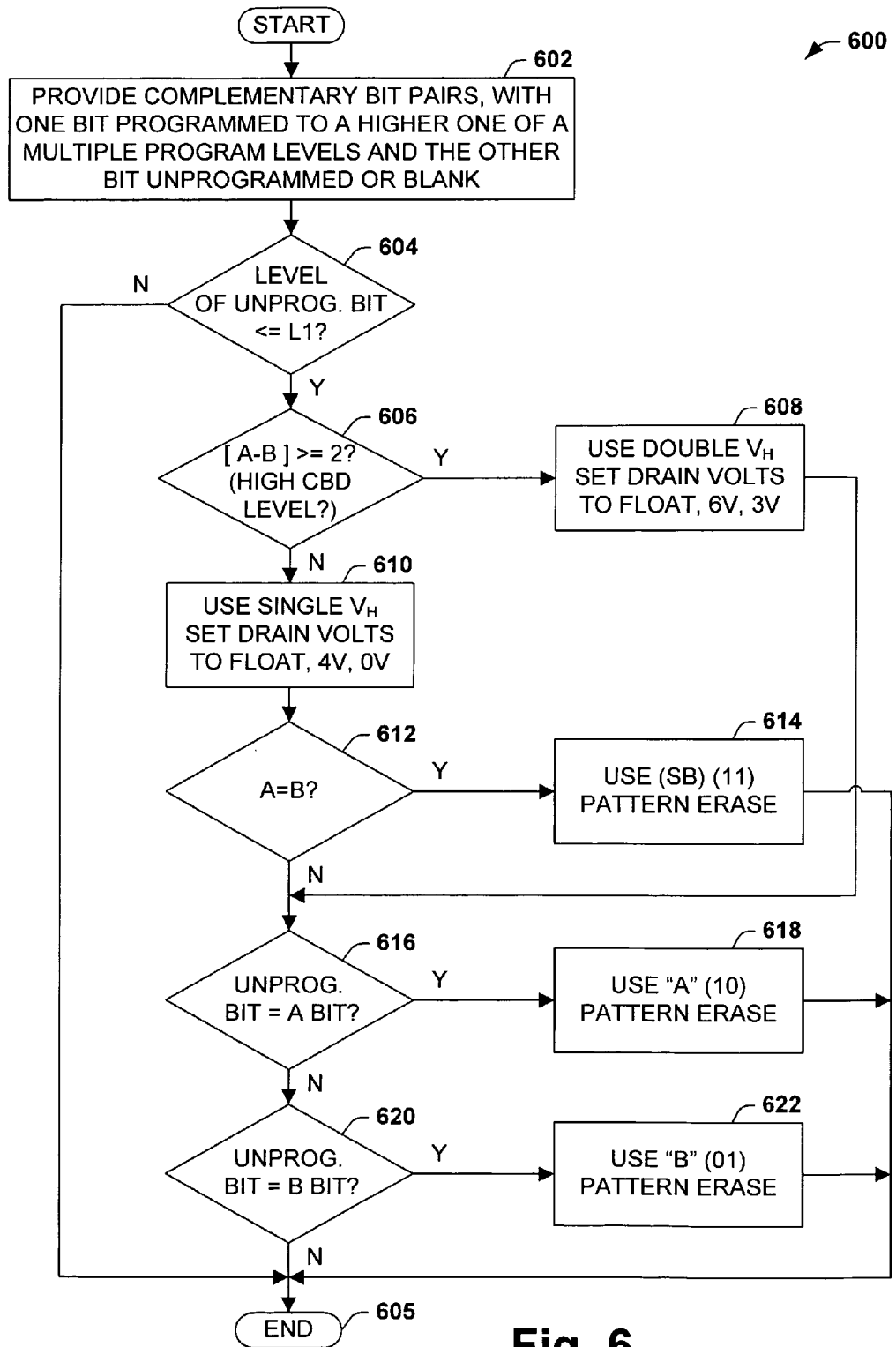
FIGS. 6 and 7 are flow diagrams illustrating exemplary methods for controlling the complimentary bit disturb level of a selected group or word of dual-bit memory cells by erasing the unprogrammed bits in accordance with one or more aspects of the present invention.
Figure 7:
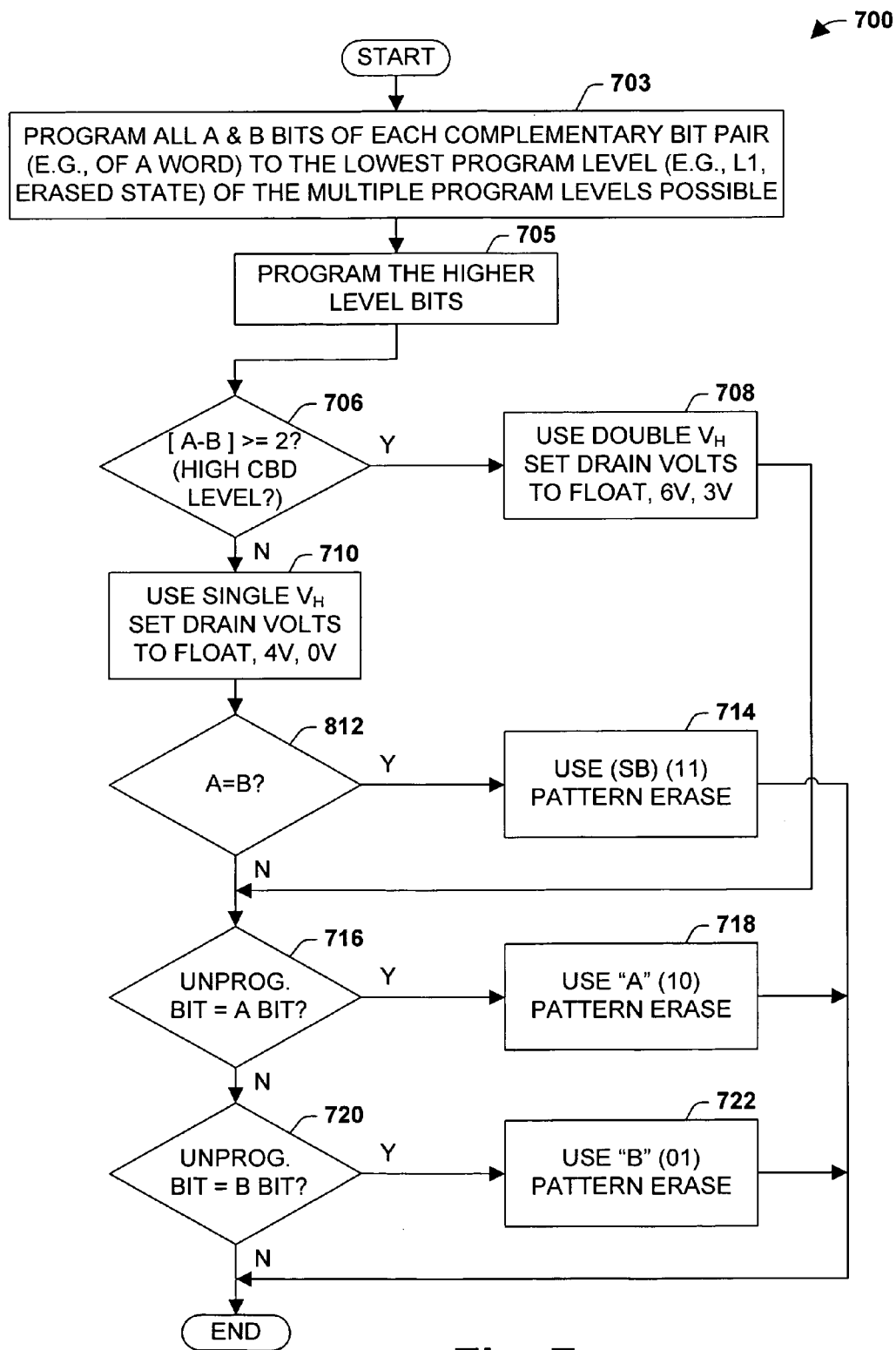

Thus, it can be appreciated that a technique would be desirable that allows the unprogrammed bits of a word or group of dual bit memory cells to be more accurately erased to a single state, after programming the higher level bits of the word or group. Turning to FIGS. 6 and 7, then, methodologies 600 and 700, respectively, are illustrated that facilitate erasing the unprogrammed bits in a word of dual bit memory cells to, for example, an L1 state. It will be appreciated that although the methodologies 600 and 700 are illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

As indicated, the methodologies illustrated herein utilize a predetermined checkerboard pattern of drain voltage levels that is applied to the word or word grouping of complimentary bit cells in several passes to store a target pattern in the word and erase the unprogrammed bits. The methodologies of the present invention are best suited for cells selected from a single word line, however, other strategies in accordance with the method are also anticipated. Among the selected cells along a word line, each cell is selected having at one unprogrammed bit and the other bit previously programmed to a higher level state. The pattern is applied, to each complementary bit-pair of the word in such a way that a higher level drain voltage is applied to the unprogrammed bit side of each complementary bit-pair, and a lower voltage on the programmed bit side of the cell. In this manner, the unprogrammed bit will be erased, and in a subsequent pass of the pattern, the programmed bit side of the cell will receive a float or inhibit, so as to prevent erasure of the programmed bit.

At the outset, the exemplary methodology begins at 602 where a group of complementary bit-pairs of memory cells comprising an "A" bit and a "B" bit are provided having one bit programmed to a higher one of a multiple program levels (e.g., L2, L3, L4) and the other bit unprogrammed or blank. Thus, the A and B bits may be represented by (e.g., a 1-2, 1-3, 1-4). It is to be appreciated that 1-1 would generally not be utilized since such a cell is not really programmed, but rather has two un-programmed or blank bits. Although portions of method 600 illustrates the steps or actions taken for a single cell, as indicated above, the method is applied to each of the selected cells of the word or group of memory cells of the array until all selected cells have been processed in accordance with the invention. Further, although selected erase patterns may be established based on the disturb level of each cell, the disturb level for all the selected cells of the word may be combined in a single combined disturb level and corresponding pattern at which the entire word is erased.

At 604, a determination is made as to the level of the unprogrammed bit, whether it is less than or equal to level 1 (L1) or some other predetermined Vt representing L1. If the level of the unprogrammed bit is less than or equal to level 1, or the predetermined Vt at 604, the method 600 ends at 605. It will be appreciated that the determination of such bit levels involves reading the bit currents of the cell as discussed supra, and that reading such currents as referenced herein generally means reading drain to source currents (Ids).

Otherwise, if the unprogrammed bit of the bit-pair is greater than L1 (or the predetermined Vt) at 604, the erase methodology continues to 606 wherein the absolute value of the difference between the A and B bits (e.g., programmed and unprogrammed bits) is compared to a level difference of 2, to determine the disturb level (CBD level) between the A and B bits of the cell. If the disturb level is greater than or equal to 2, for example, then a stronger field is determined to be required of a subsequent erase operation at 608. At 608 a "Double $V_H$" hot hole erase field is established by the use of drain voltages set to a "Float, 6V, and 3V" drain voltage pattern. This pattern is used for potentially higher disturb levels, to ensure that the unprogrammed bit is sufficiently erased. If, however, at 606 it is determined that the disturb level is less than 2, a weaker "Single $V_H$" hot hole erase field is established at 610 by the use of drain voltages set to a "Float, 4V, and 0V" drain voltage pattern. The details and usefulness of these patterns will be discussed in greater detail later in association with FIGS. 10–14.

After the drain voltages have been set to a "Float, 4V, and 0V" drain voltage pattern at 610, another determination may be made at 612 whether the A bit is equal to the B bit. If bits A and B are found to be of the same level at 612, then a "Same bit (SB) erase pattern (e.g., 11 pattern) is selected at 614. If, however, at 612 it is determined that the bit levels are not equal, then a determination is made whether the A bit is the unprogrammed bit at 616 and an "A" erase pattern (e.g., 10 pattern) is established or used at 618, otherwise a determination is made whether the B bit is the unprogrammed bit at 620 and a "B" erase pattern (e.g., 01 pattern) is established or used at 622.

Thereafter, at 605 the erase methodology may continue for the determination of the disturb levels and establishment of the erase pattern for each of the cells as indicated above, wherein a combined disturb level may be subsequently determined and a corresponding erase pattern performed in multiple passes until a target pattern is stored in the word or group of cells and the method ends. For example, after the determination is made of the disturb level of each cell of the word, a mathematical average, mean, sigma, or another such function of a combined disturb level of the cells of the word is computed. This combined disturb level is then used to select which erase pattern is most representative of the entire word, and this pattern is then used to erase the unprogrammed bits of the word to an L1 state.

Although the combined disturb level method described above is likely the fastest and most efficient method discussed herein, alternately, cells having a common or similar disturb level may be grouped in accordance with some steps of the invention and erased utilizing a common associated erase pattern. Finally, individual cells may be erased according to the method. Other such bit and cell grouping arrangements are anticipated in accordance with the method of the present invention.

Method 700 of FIG. 7 is similar to that of FIG. 6, and as such need not be completely described again for the sake of brevity. For example, the determination of the level of the unprogrammed bit of step 604 need not be performed if an initial erase (or program to L1) is performed as illustrated by 703 of method 700. Initially method 700, for example, all A and B bits of each complementary bit-pair (e.g., of a word) are programmed to the lowest program level (e.g., L1, or an erased state) of the possible multiple program levels (e.g., L1, L2, L3, L4).

Then, at 705 one bit of each of the complimentary bit-pairs is programmed to a higher level, as was provided at 602 of FIG. 6. Thereafter, at 706 of FIG. 7, the CBD level between the programmed and the unprogrammed or blank bits is determined similar to that of 606, wherein a CBD compensation level is established for the bit-pairs of the word, and wherein the succeeding steps of FIG. 7 proceed similar to that of the steps of FIG. 6. As before, a combined disturb (CBD) level may be computed for the word based on a mathematical average, mean, sigma, or another such function of a combined disturb level of the cells of the word. This combined disturb level is then used to select which erase pattern is most representative of the entire word, and this pattern is then used to erase the unprogrammed bits of the word to, for example, an L1 state.

Figures 8, 9:
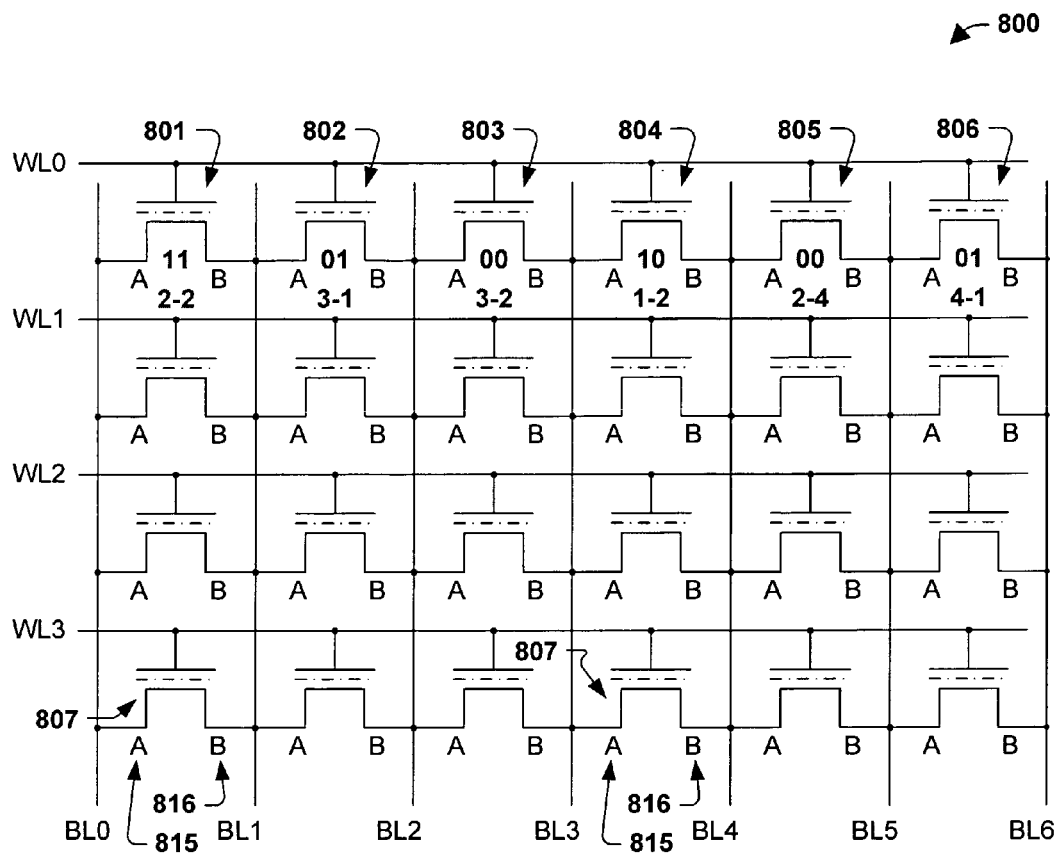
FIG. 8 is a schematic illustration of a portion of a memory core of dual-bit multi-level cells such as may include at least part of one of the cores depicted in FIG. 1, wherein one or more aspects of the present invention may be demonstrated.
FIG. 9 is a list illustrating several combinations of complimentary bit disturb erase state requirement possibilities for a dual-bit cell, and four corresponding fix patterns used in accordance with an aspect of the present invention.

FIG. 8, for example, illustrates an exemplary portion of a memory core or array of dual-bit multi-level cells such as may include at least part of one of the cores depicted in FIG. 1, wherein one or more aspects of the erase methodologies 600 and 700 of the present invention may be demonstrated. Array portion 800 comprises rows of word lines (e.g., WL0–WL3) connected to gate terminals of dual-bit memory cells (e.g., 801, 802, 803, 804, 805, and 806 distributed along a word line WL0), and columns of bit lines (e.g., BL0–BL6) connected to source and drain terminals of the respective memory cells (e.g., 801–806). Individual cells 807 have A and B bit-pairs, 815 and 816 respectively residing between adjacent bitlines (e.g., BL0 and BL1, or BL3 and BL4). Again, source and drain terminals are used interchangeably depending on the respective A or B bit referenced within each cell of the array.

In operation of the method of the present invention, the state machine, for example, selects a word of memory cells preferably arranged along a common word line (e.g., 801, 802, 803, 804, 805, and 806 distributed along word line WL0). The A–B bit-pairs of the individual cells may have multiple levels (e.g., L1, L2, L3, L4) and associated bit states, for example, four levels per bit. For example, in the present example of four levels for each bit, memory cells 801, 802, 803, 804, 805, and 806 may have data states 2-2, 3-1, 3-2, 1-2, 2-4, and 4-1, respectively.

FIG. 9 illustrates that regardless of the particular levels that exist within each bit-pair, however, the actions taken in association with the method of the present invention may be reduced to one of four erase cases or fix actions 900. That is, a code is contrived, wherein a "1" represents that an erase action is to be taken, and a "0" represents that no erase action is taken. Thus, for the complementary bit-pair, when neither the A nor the B bit need to be erased (fixed) this case may be represented by a "00". When the A bit needs to be fixed and the B bit does not, this case is represented by a "10". When the B bit needs to be fixed and the A bit does not, this case is represented by a "01". Finally, when the A and the B bit are the same and both need to be erased or fixed, this case is represented by a "11".

Therefore, returning to the present example of memory cells 801, 802, 803, 804, 805, and 806 having data states 2-2, 3-1, 3-2, 1-2, 2-4, and 4-1, respectively, an erase or fix action may be assigned 11, 01, 00, 10, 00, and 01, respectively. This may be illustrated as:

| memory cell: | 801 | 802 | 803 | 804 | 805 | 806 |
|---|---|---|---|---|---|---|
| data states: | 2-2 | 3-1 | 3-2 | 1-2 | 2-4 | 4-1 |
| fix action: | 11 | 01 | 00 | 10 | 00 | 01 |

These fix actions and data states indicate that after all the higher levels are initially programmed, for example, that both A and B bits of cell 801 are to be erased (fixed), bit B of cell 802, bit A of cell 804, and bit B of cell 806 are to be erased, while all others are to remain at the current data state. Cell groups can be selected having similar erase patterns, or a custom erase pattern may be created to accommodate the existing cells, in accordance with an aspect of the present invention, as detailed infra.

Figure 10:
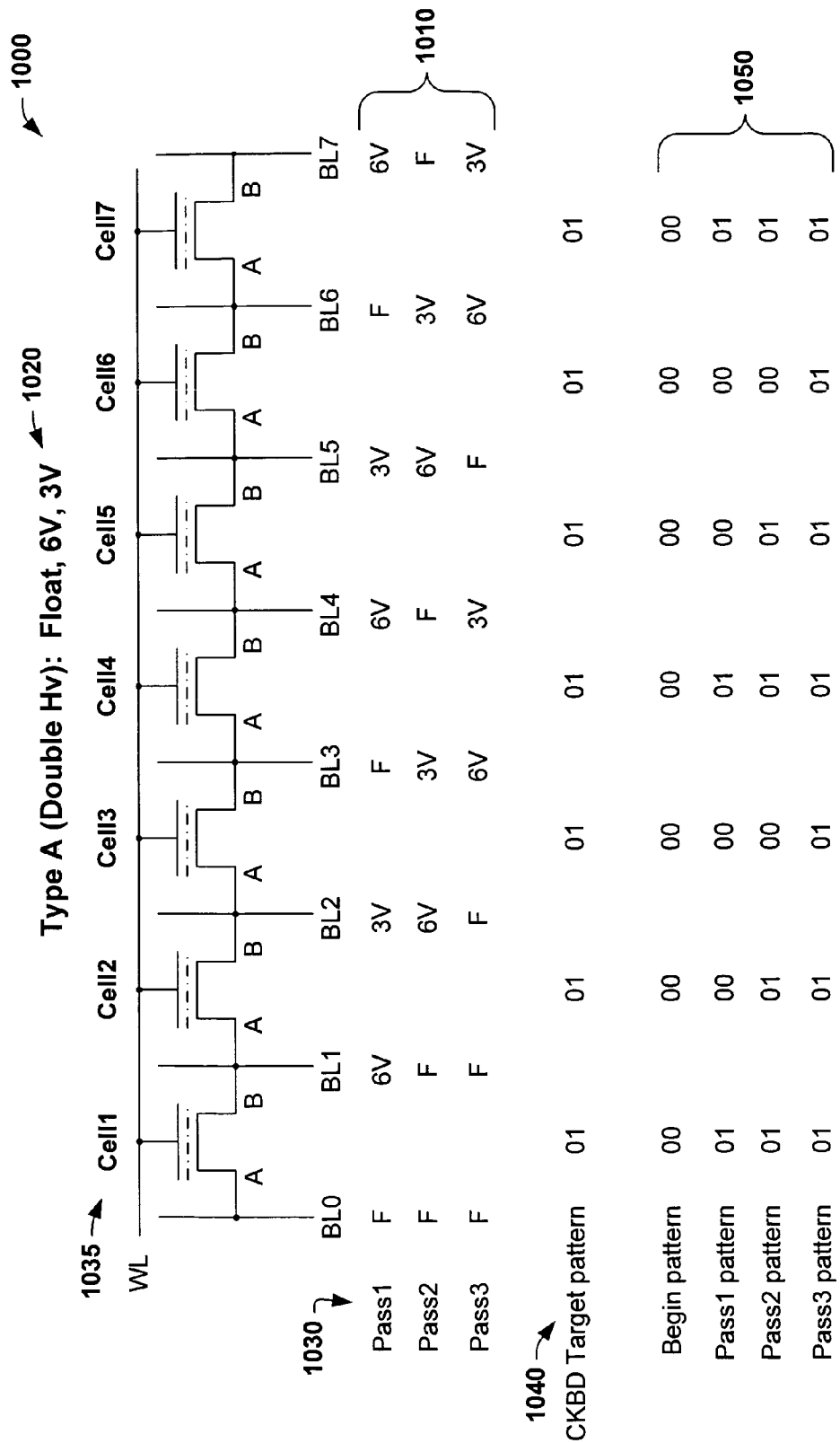
FIG. 10 is a schematic illustration of a select word grouping of dual-bit memory cells and one or more checkerboard patterns of double Hv drain voltages that may be applied to the cells to store a target pattern and erase select cells in accordance with a method aspect of the present invention.

FIG. 10 illustrates a Type A (Double Hv) erase pattern 1000. The type A erase pattern 1000 applies a checkerboard pattern of drain voltages 1010 at a double Hv level 1020 in one or more passes (e.g., Pass1, Pass2, and Pass3) 1030 to a word grouping of dual-bit memory cells (e.g., Cell1–Cell7) 1035. After the one or more passes 1030 of the checkerboard pattern of drain voltages 1010, a target pattern (e.g., CKBD Target pattern) 1040 is stored in the cells to erase select unprogrammed bits of the memory cells 1035 in accordance with one or more method aspects of the present invention. Initially, the erase or fix action codes 900 illustrated in FIG. 9 are applied in FIG. 10 as code patterns 1050 (e.g., Begin pattern, Pass1 pattern, Pass2 pattern, and Pass3 pattern), which are then decoded to the checkerboard pattern of drain voltages 1010. A "00" in the "begin pattern" represents the previous or initial bit-states of the bit-pairs. The checkerboard pattern of drain voltages 1010 is then applied to the word grouping of cells (e.g., Cell1–Cell7) 1035 during a number of passes (e.g., Pass1, Pass2, and Pass3) 1030 to store the target pattern 1040 in the cells 1035 and erase the unprogrammed or blank bits to a single level. In this way, CBD control of the word is maintained.

Although target pattern 1040 illustrates a B fix or erase action (01), an A fix action (10), or an A and B fix action (11) (same bit SB) may also be taken upon the selected word grouping of memory cells 1035, including no fix action (00), wherein a "1" represents that an erase action is to be taken, and a "0" represents that no erase action is taken. In addition, the particular ordering of the drain voltages of the double Hv level 1020, for example, Float (F), 6V, 3V (I, Inhibit voltage) as applied in the erase checkerboard pattern 1010, enables the specified unprogrammed bits of the bit-pairs to be erased. As the code pattern 1050 is based on the particular fix/erase action 900 to be taken, and the drain voltage pattern 1010 is decoded from these fix actions 900, the ordering of the drain voltages is derived from the fix action required by the selected word grouping of memory cells 1035 and the particular disturb pattern within the bit-pairs A–B.

Thus, while differences may exist within the word grouping 1035, selecting bit-pairs having a common disturb pattern permits a simpler target pattern and is more desirable for the optimum effectiveness of the present invention to provide erasure of the unprogrammed bits and maintain CBD control. Conversely, when a word grouping 1035 of bit-pairs is selected not having the same disturb pattern, a custom target pattern may also be utilized to provide erasure of the unprogrammed bits and maintain CBD control.

Further, the particular ordering and placement of the inhibit voltage (I) (e.g., 3V) in the drain voltage patterns provide a means to prevent the other cells of the bit-pairs programmed to higher levels from being erased.

Figure 11:
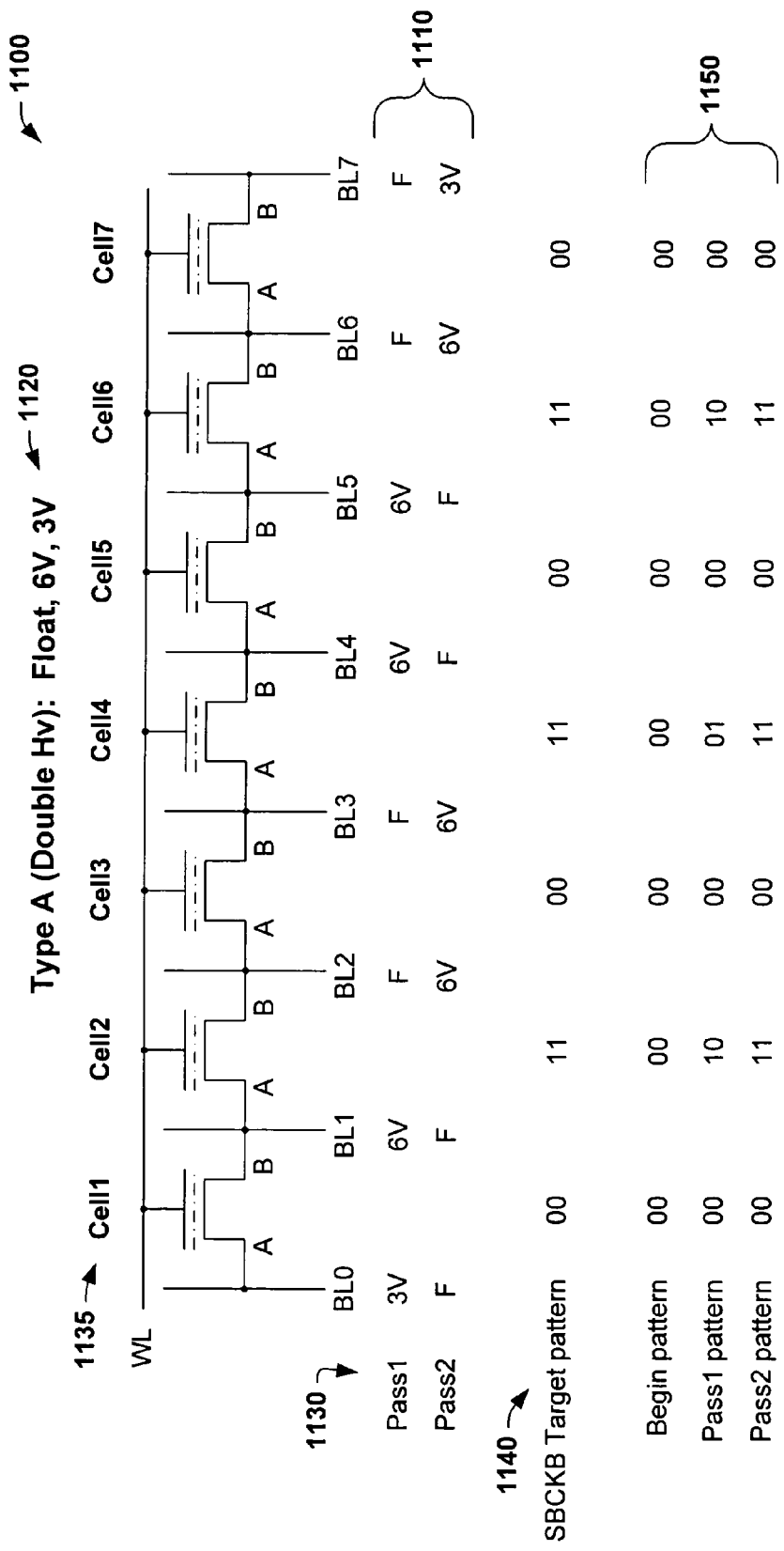
FIG. 11 is a schematic illustration of a select word grouping of dual-bit memory cells and one or more same-bit checkerboard patterns of double Hv drain voltages that may be applied to the cells to store a target pattern and erase select cells in accordance with a method aspect of the present invention.
Figure 13:
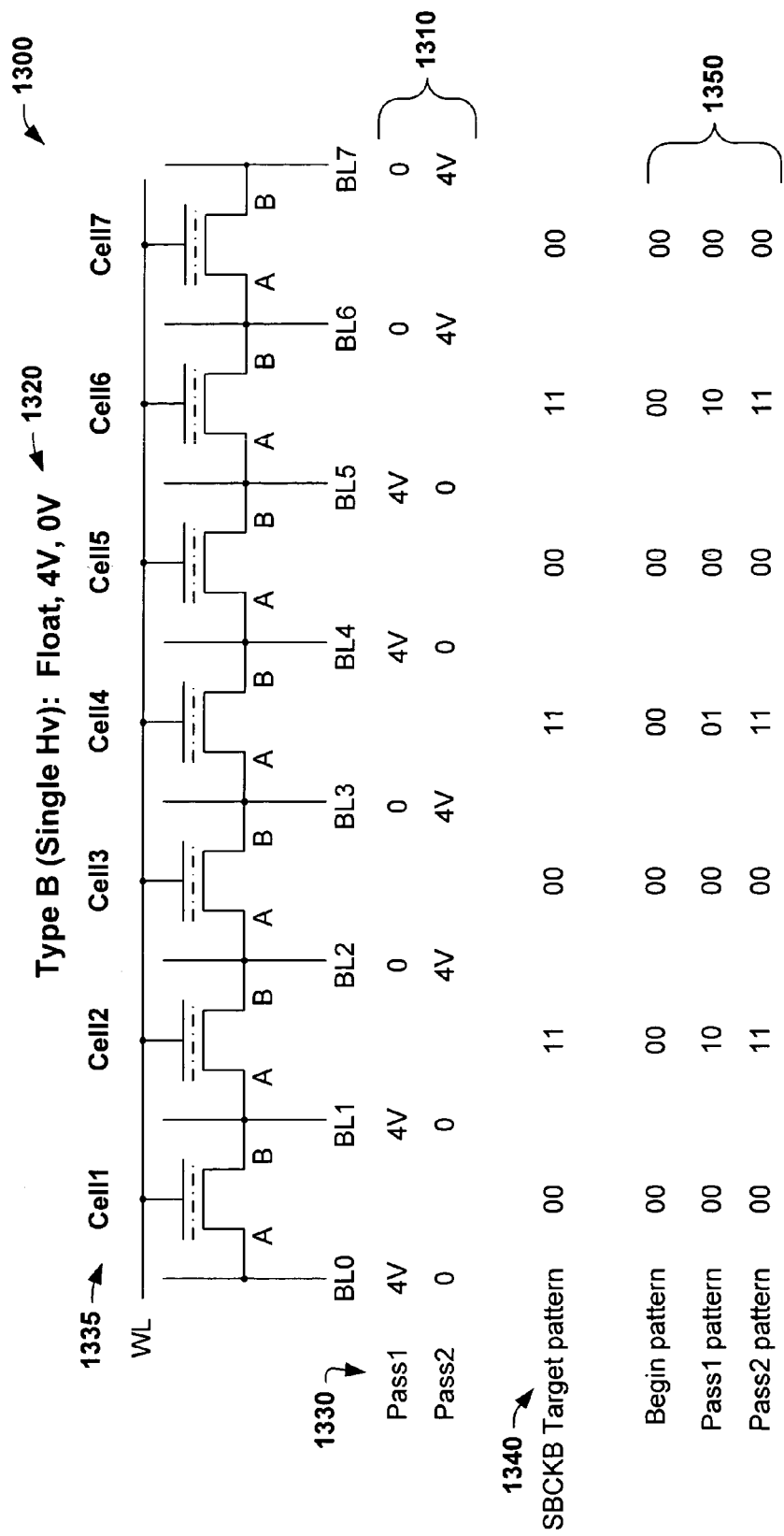
FIG. 13 is a schematic illustration of a select word grouping of dual-bit memory cells and one or more same-bit checkerboard patterns of single Hv drain voltages that may be applied to the cells to store a target pattern and erase select cells in accordance with a method aspect of the present invention.

The type A (Double Hv) erase pattern 1000 of FIGS. 10 and 1100 of FIG. 11 is selected to provide a stronger field for the hot hole erase, most suitable when disturb levels within the bit-pairs are greater, for example, where:

$|A-B| >= 2$ as determined at 606 of FIG. 6, and 706 of FIG. 7 and selected at 608 of FIG. 6, and 708 of FIG. 7. Otherwise, when disturb levels within the bit-pairs are smaller, for example, where:

$|A-B| < 2$ as determined at 606 of FIG. 6, and 706 of FIG. 7 and selected at 610 of FIG. 6, and 710 of FIG. 7, the type B (Single Hv) erase pattern 1300 of FIGS. 13 and 1400 of FIG. 14 is selected to provide a weaker field for the hot hole erase.

Thus, adjusting or selecting the level of the drain voltages applied to the memory cells provides compensation for the level of disturbance (CBD level) present in the group of cells. In this manner, erasing the bit or program level in accordance with one or more aspects of the present invention improves (e.g., decreases) the Vt distribution at the program level of the erased state and thereby improves the accuracy of subsequent higher level programming operations and mitigates false or erroneous reads of the states of such program levels.

FIG. 11 illustrates a Type A (Double Hv) same-bit (SB) erase pattern 1100. The type A erase pattern 1100 applies a same-bit checkerboard pattern of drain voltages 1110 at a double Hv level 1120 in one or more passes (e.g., Pass1, and Pass2) 1130 to a word grouping of dual-bit memory cells (e.g., Cell1–Cell7) 1135. The SB erase pattern 1100 is useful where each bit of the bit-pair is the same (e.g., 2-2, 3-3, and 4-4), and both bits need to be erased without regard to the previous program level. A "00" in the "begin pattern" represents the previous or initial bit-states of the bit-pairs. After the one or more passes 1130 of the checkerboard pattern of drain voltages 1110, a target pattern (e.g., SBCKBD Target pattern) 1140 is stored in the cells to erase select unprogrammed bits of the memory cells 1135 in accordance with one or more method aspects of the present invention. Initially, the erase or fix action codes 900 illustrated in FIG. 9 are applied in FIG. 11 as code patterns 1150 (e.g., Begin pattern, Pass1 pattern, and Pass2 pattern), which are then decoded to the same-bit checkerboard pattern of drain voltages 1110. The same-bit checkerboard pattern of drain voltages 1110 is then applied to the word grouping of cells (e.g., Cell1–Cell7) 1135 during a number of passes (e.g., Pass1, and Pass2) 1130 to store the target pattern 1140 in the cells 1135 and erase the unprogrammed or blank bits to a single level. In this way, CBD control of the word is maintained.

Although target pattern 1140 illustrates an A and B fix or erase action (11) (same bit SB), a B fix action (01), or an A fix action (10) may also be taken upon the selected word grouping of memory cells 1135, including no fix action (00). In addition, the particular ordering of the drain voltages of the double Hv level 1120, for example, Float (F), 6V, 3V (I, Inhibit voltage) as applied in the erase same-bit checkerboard pattern 1110, enables the specified unprogrammed bits of the bit-pairs to be erased. As the code pattern 1150 is based on the particular fix/erase action 900 to be taken, and the drain voltage pattern 1110 is decoded from these fix actions 900, the ordering of the drain voltages is derived from the fix action required by the selected word grouping of memory cells 1135 and the particular disturb pattern within the bit-pairs A–B.

Thus, while differences may exist within the word grouping 1135, selecting bit-pairs having a common disturb pattern permits a simpler target pattern and is more desirable for the optimum effectiveness of the present invention to provide erasure of the unprogrammed bits and maintain CBD control. Conversely, when a word grouping 1135 of bit-pairs is selected not having the same disturb pattern, a custom target pattern may also be utilized to provide erasure of the unprogrammed bits and maintain CBD control.

Further, the particular ordering and placement of the inhibit voltage (I) (e.g., 3V) in the drain voltage patterns provide a means to prevent the other cells of the bit-pairs programmed to higher levels from being erased.

Figure 12:
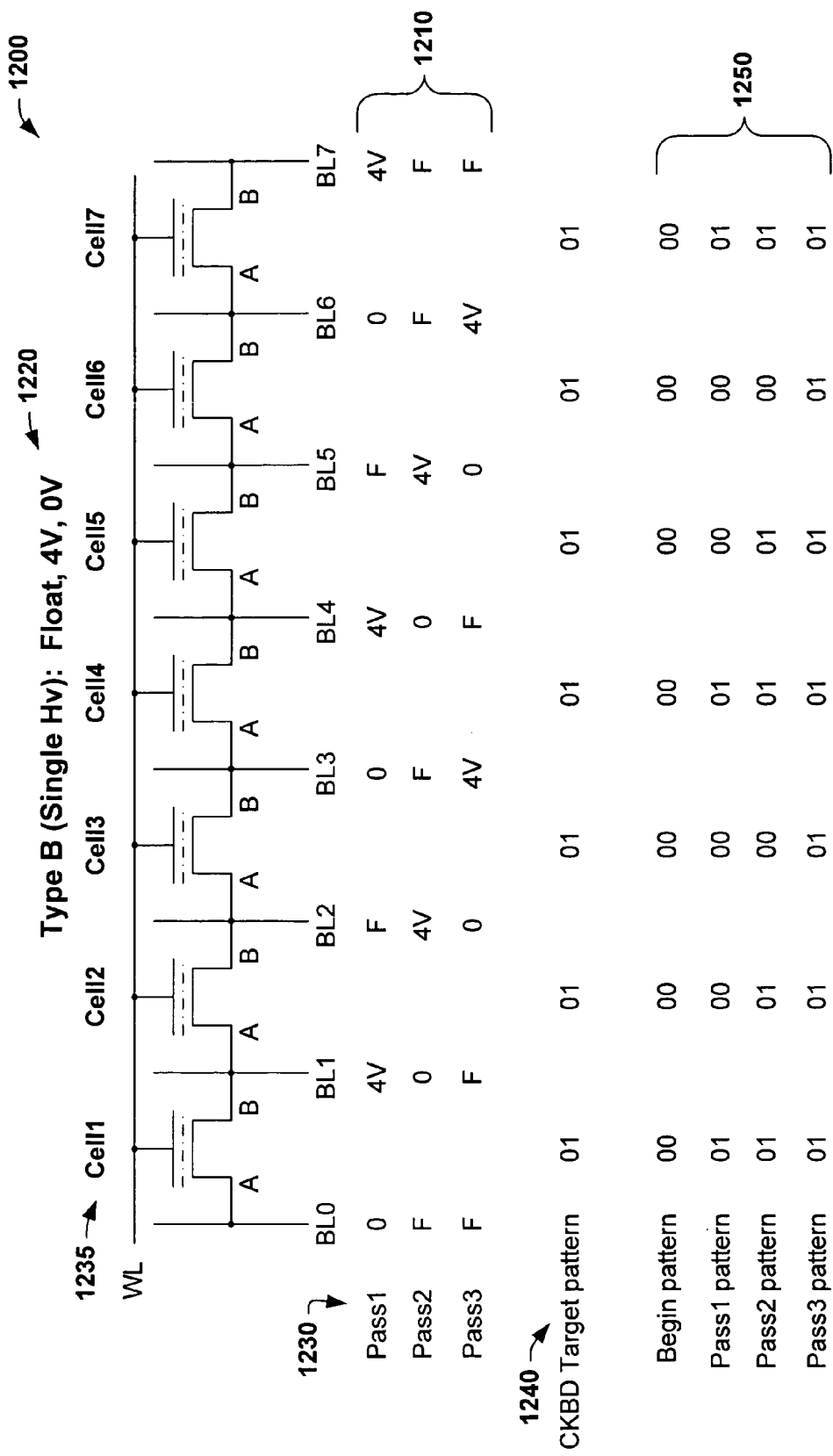
FIG. 12 is a schematic illustration of a select word grouping of dual-bit memory cells and one or more checkerboard patterns of single Hv drain voltages that may be applied to the cells to store a target pattern and erase select cells in accordance with a method aspect of the present invention.

FIG. 12 illustrates a Type B (Single Hv) erase pattern 1200. The type B erase pattern 1200 applies a checkerboard pattern of drain voltages 1210 at a single Hv level 1220 in one or more passes (e.g., Pass1, Pass2, and Pass3) 1230 to a word grouping of dual-bit memory cells (e.g., Cell1–Cell7) 1235. After the one or more passes 1230 of the checkerboard pattern of drain voltages 1210, a target pattern (e.g., CKBD Target pattern) 1240 is stored in the cells to erase select unprogrammed bits of the memory cells 1235 in accordance with one or more method aspects of the present invention. Initially, the erase or fix action codes 900 illustrated in FIG. 9 are applied in FIG. 12 as code patterns 1250 (e.g., Begin pattern, Pass1 pattern, Pass2 pattern, and Pass3 pattern), which are then decoded to the checkerboard pattern of drain voltages 1210. A "00" in the "begin pattern" represents the previous or initial bit-states of the bit-pairs. The checkerboard pattern of drain voltages 1210 is then applied to the word grouping of cells (e.g., Cell1–Cell7) 1235 during a number of passes (e.g., Pass1, Pass2, and Pass3) 1230 to store the target pattern 1240 in the cells 1235 and erase the unprogrammed or blank bits to a single level. In this way, CBD control of the word is maintained.

Although target pattern 1240 illustrates a B fix or erase action (01), an A fix action (10), or an A and B fix action (11) (same bit SB) may also be taken upon the selected word grouping of memory cells 1235, including no fix action (00), wherein a "1" represents that an erase action is to be taken, and a "0" represents that no erase action is taken. In addition, the particular ordering of the drain voltages of the single Hv level 1220, for example, Float (F), 4V, 0V (I, Inhibit voltage) as applied in the erase checkerboard pattern 1210, enables the specified unprogrammed bits of the bit-pairs to be erased. As the code pattern 1250 is based on the particular fix/erase action 900 to be taken, and the drain voltage pattern 1210 is decoded from these fix actions 900, the ordering of the drain voltages is derived from the fix action required by the selected word grouping of memory cells 1235 and the particular disturb pattern within the bit-pairs A–B.

Thus, while differences may exist within the word grouping 1235, selecting bit-pairs having a common disturb pattern permits a simpler target pattern and is more desirable for the optimum effectiveness of the present invention to provide erasure of the unprogrammed bits and maintain CBD control. Conversely, when a word grouping 1235 of bit-pairs is selected not having the same disturb pattern, a custom target pattern may also be utilized to provide erasure of the unprogrammed bits and maintain CBD control.

Further, the particular ordering and placement of the inhibit voltage (I) (e.g., 0V) in the drain voltage patterns provide a means to prevent the other cells of the bit-pairs programmed to higher levels from being erased.

FIG. 13 illustrates a Type A (Double Hv) same-bit (SB) erase pattern 1300. The type A erase pattern 1300 applies a same-bit checkerboard pattern of drain voltages 1310 at a single Hv level 1320 in one or more passes (e.g., Pass1, and Pass2) 1330 to a word grouping of dual-bit memory cells (e.g., Cell1–Cell7) 1335. The SB erase pattern 1300 is useful where each bit of the bit-pair is the same (e.g., 2-2, 3-3, and 4-4), and both bits need to be erased without regard to the previous program level. A "00" in the "begin pattern" represents the previous or initial bit-states of the bit-pairs. After the one or more passes 1330 of the checkerboard pattern of drain voltages 1310, a target pattern (e.g., SBCKBD Target pattern) 1340 is stored in the cells to erase select unprogrammed bits of the memory cells 1335 in accordance with one or more method aspects of the present invention. Initially, the erase or fix action codes 900 illustrated in FIG. 9 are applied in FIG. 13 as code patterns 1350 (e.g., Begin pattern, Pass1 pattern, and Pass2 pattern), which are then decoded to the same-bit checkerboard pattern of drain voltages 1310. The same-bit checkerboard pattern of drain voltages 1310 is then applied to the word grouping of cells (e.g., Cell1–Cell7) 1335 during a number of passes (e.g., Pass1, and Pass2) 1330 to store the target pattern 1340 in the cells 1335 and erase the unprogrammed or blank bits to a single level. In this way, CBD control of the word is maintained.

Although target pattern 1340 illustrates an A and B fix or erase action (11) (same bit SB), a B fix action (01), or an A fix action (10) may also be taken upon the selected word grouping of memory cells 1335, including no fix action (00). In addition, the particular ordering of the drain voltages of the single Hv level 1320, for example, Float (F), 4V, 0V (I, Inhibit voltage) as applied in the erase same-bit checkerboard pattern 1310, enables the specified unprogrammed bits of the bit-pairs to be erased. As the code pattern 1350 is based on the particular fix/erase action 900 to be taken, and the drain voltage pattern 1310 is decoded from these fix actions 900, the ordering of the drain voltages is derived from the fix action required by the selected word grouping of memory cells 1335 and the particular disturb pattern within the bit-pairs A–B.

Thus, while differences may exist within the word grouping 1335, selecting bit-pairs having a common disturb pattern permits a simpler target pattern and is more desirable for the optimum effectiveness of the present invention to provide erasure of the unprogrammed bits and maintain CBD control. Conversely, when a word grouping 1335 of bit-pairs is selected not having the same disturb pattern, a custom target pattern may also be utilized to provide erasure of the unprogrammed bits and maintain CBD control.

Further, the particular ordering and placement of the inhibit voltage (I) (e.g., 0V) in the drain voltage patterns provide a means to prevent the other cells of the bit-pairs programmed to higher levels from being erased.

Thus, the present invention compensates for the disturbance level that exists between the complementary bit-pairs of the word, improves the Vt distribution at the program level of the erased state and thereby improves the accuracy of subsequent higher level programming operations and mitigates false or erroneous reads of the states of such program levels.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of erasing to maintain complimentary bit disturb control of a group of complementary bit-pairs of memory cells, each bit having multiple programming levels, the method comprising:
    comparing the program levels of a programmed bit and a complimentary unprogrammed bit within the bit-pairs of the group of memory cells to determine a disturb level for each bit-pair of the group;
    determining a combined disturb level representative of the individual disturb levels determined for the bit-pairs of the group;
    setting a drain voltage and a number of program passes for a target pattern to be stored in the memory cell based on the combined disturb level determined for the group; and
    erasing the unprogrammed bit of the bit-pairs to one of the program levels using the drain voltage and the number of program passes of the target pattern based on the combined disturb level to compensate for the disturbance level that exists between the complementary bit-pairs of the group of memory cells.

2. The method of claim 1, further comprising:
    providing the group of memory cells after an initial erasure of the group.

3. The method of claim 2, further comprising:
    providing the group of memory cells after a subsequent programming of a portion of the bits of the group to one or more higher program levels.

4. The method of claim 1, wherein the group of complementary bit-pairs of memory cells comprises a word of memory cells.

5. The method of claim 4, wherein the group of memory cells is selected from a single word line.

6. The method of claim 4, wherein the word comprises one or more complementary bit-pairs of memory cells.

7. The method of claim 6, wherein setting a drain voltage and a number of program passes for a target pattern to be stored in the memory cell based on the combined disturb level determined for the group comprises:
    determining if the combined disturb level is greater than a predetermined value; and
    applying a float condition, a first drain voltage, and a first inhibit voltage comprising a first pattern and an associated first number of program passes of a first target pattern to the group of memory cells if the combined disturb level is greater than the predetermined value; otherwise
    applying a float condition, a second drain voltage, and a second inhibit voltage comprising a second pattern and an associated second number of program passes of a second target pattern to the group of memory cells if the combined disturb level is greater than the predetermined value
    storing into the group of memory cells the selected pattern in the associated number of program passes at the applied float condition, drain voltage, and inhibit voltage selected based on the combined disturb level.

8. The method of claim 7, wherein the first drain voltage is about 6 volts and the first inhibit voltage is about 3 volts.

9. The method of claim 7, wherein the second drain voltage is about 4 volts and the second inhibit voltage is about 0 volts.

10. The method of claim 7, wherein the first number of program passes comprises three passes of the first pattern.

11. The method of claim 7, wherein the second number of program passes comprises two passes of the second pattern.

12. The method of claim 1, wherein comparing the program levels of a programmed bit and a complimentary unprogrammed bit within the bit-pairs of the group of memory cells to determine a disturb level for each bit-pair of the group comprises:
    reading the associated program level of the programmed bit and the associated program level of each bit-pair; and
    subtracting the associated program level of the programmed bit from the associated program level of the unprogrammed bit to provide a disturb level for each bit-pair.

13. The method of claim 1, wherein comparing the program levels of a programmed bit and a complimentary unprogrammed bit within the bit-pairs of the group of memory cells to determine a disturb level for each bit-pair of the group comprises:
    determining the Vt levels of the programmed and the unprogrammed bits of each bit-pair; and
    subtracting the Vt level of the programmed bit from the Vt level of the unprogrammed bit to provide a disturb level for each bit-pair.

14. The method of claim 1, wherein determining the combined disturb level representative of the individual disturb levels determined for the bit-pairs of the group comprises computing one of an average, mean, sum, sigma, and another math function representative of the individual disturb levels.

15. The method of claim 1, wherein erasing the unprogrammed bit of the bit-pairs to one of the program levels comprises erasing the unprogrammed bit of the bit-pairs to a lowest level of the program levels.

16. The method of claim 1, wherein the combined disturb level is selected from one of the programming levels.

17. The method of claim 1, wherein the multiple programming levels comprises four programming levels.

18. A method of erasing to maintain complimentary bit disturb control of complementary bit-pairs of a word grouping of memory cells, each bit having multiple programming levels, the method comprising:
    providing the word of memory cells after an initial erasure and programming of a portion of the bits of the word to one or more higher program levels;
    comparing the program levels of a programmed bit and a complimentary unprogrammed bit within the bit-pairs of the word grouping of core memory cells to determine a disturb level for each bit-pair of the word grouping;

determining a combined disturb level representative of the individual disturb levels determined for the bit-pairs of the word;

setting a drain voltage and a number of program passes for a target pattern to be stored in the memory cell based on the combined disturb level determined for the word; and erasing the unprogrammed bit of the bit-pairs to one of the program levels using the drain voltage and the number of program passes of the target pattern based on the combined disturb level to compensate for the disturbance level that exists between the complementary bit-pairs of the word.

19. The method of claim 18, wherein the word of core memory cells comprises memory cells selected from a single word line.

20. The method of claim 19, wherein the word comprises one or more complementary bit-pairs of memory cells.

21. A method of erasing to maintain complimentary bit disturb control of a complementary bit-pair of a core memory cell having multiple programming levels, the method comprising:

providing the complementary bit-pair having a bit programmed to a higher one of the multiple program levels;

determining the level of an unprogrammed bit of the bit-pair based upon a comparison with the possible program levels of the bit;

determining a disturb compensation level for the unprogrammed bit based upon a comparison of the difference between the program level of the programmed bit and the level determined for the unprogrammed bit;

setting a drain voltage and a number of program passes for a target pattern to be stored in the memory cell corresponding to the disturb compensation level determined; and erasing the unprogrammed bit of the bit-pair to one of the program levels using the drain voltage and the number of program passes of the target pattern based on the disturb compensation comparison.

* * * * *